US012642014B2

(12) United States Patent
Fujibayashi

(10) Patent No.: US 12,642,014 B2
(45) Date of Patent: May 26, 2026

(54) SILICON CARBIDE WAFER MANUFACTURING APPARATUS

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Hiroaki Fujibayashi, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 258 days.

(21) Appl. No.: 18/531,929

(22) Filed: Dec. 7, 2023

(65) Prior Publication Data

US 2024/0213019 A1      Jun. 27, 2024

(30) Foreign Application Priority Data

Dec. 27, 2022    (JP) .................................. 2022-210956

(51) Int. Cl.
| | |
|---|---|
| *H01L 21/02* | (2006.01) |
| *H10P 14/20* | (2026.01) |
| *H10P 14/24* | (2026.01) |
| *H10P 72/00* | (2026.01) |

(52) U.S. Cl.
CPC .......... *H10P 14/2904* (2026.01); *H10P 14/24* (2026.01); *H10P 72/0431* (2026.01)

(58) Field of Classification Search
CPC ......... H01L 21/02378; H01L 21/02529; H01L 21/02576; H01L 21/0262; H01L 21/67098; C30B 29/36
See application file for complete search history.

(56) References Cited

U.S. PATENT DOCUMENTS

| | | | |
|---|---|---|---|
| 2006/0021574 A1* | 2/2006 | Armour ............ C23C 16/45574 |
| | | | 427/248.1 |
| 2018/0135203 A1* | 5/2018 | Suzuki .................... C30B 25/10 |
| 2020/0173053 A1* | 6/2020 | Umeta .................... C30B 29/36 |
| 2022/0149160 A1* | 5/2022 | Ishibashi ................. C30B 25/14 |

FOREIGN PATENT DOCUMENTS

| | | | |
|---|---|---|---|
| JP | 2002-016008 A | | 1/2002 |
| JP | 2002008062 A | * | 1/2002 |

* cited by examiner

*Primary Examiner* — Hua Qi
(74) *Attorney, Agent, or Firm* — Posz Law Group, PLC

(57) ABSTRACT

In a silicon carbide wafer manufacturing apparatus, a cooling unit is capable of cooling a separation space to 400° C. or lower, and a supply pipe includes a dopant gas supply pipe through which an ammonia-based gas included in a reactant gas is to be supplied, a growth gas supply pipe through which a growth gas containing a silane-based gas and a chlorine-based gas and included in the reactant gas is to be supplied, and an inert gas supply pipe through which an inert gas included in the reactant gas is to be supplied between a portion of the separation space to which the ammonia-based gas is to be supplied and a portion of the separation space to which the chlorine-based gas is to be supplied.

16 Claims, 9 Drawing Sheets

SILICON CARBIDE WAFER MANUFACTURING APPARATUS

CROSS REFERENCE TO RELATED APPLICATION

The present application claims the benefit of priority from Japanese Patent Application No. 2022-210956 filed on Dec. 27, 2022. The entire disclosure of the above application is incorporated herein by reference.

TECHNICAL FIELD

The present disclosure relates to an apparatus for manufacturing a silicon carbide wafer made of silicon carbide (hereinafter, also simply referred to as SiC).

BACKGROUND

Conventionally, there has been proposed a semiconductor wafer manufacturing apparatus for growing an epitaxial layer, which is a semiconductor layer, on a surface of a seed substrate by rotating and heating the seed substrate in a state where the seed substrate is placed on a susceptor in a reaction chamber into which a reactant gas containing a source gas is introduced.

SUMMARY

The present disclosure provides a silicon carbide wafer manufacturing apparatus including a chamber, a susceptor, a supply pipe, a shower head, and a cooling unit. The chamber forms a reaction chamber to which a reactant gas is to be supplied for growing an epitaxial layer made of silicon carbide on a front surface of a seed substrate made of silicon carbide. The chamber has a cylindrical shape having an upper portion and a lower portion. The susceptor is disposed in the chamber at a position close to the lower portion, and the seed substrate is to be disposed on the susceptor. The supply pipe is connected to the upper portion of the chamber and is configured to supply the reactant gas to the reaction chamber. The shower head is disposed to partition the reaction chamber into a growth space close to the lower portion and a separation space close to the upper portion. The shower head has a plurality of through holes through which the growth space and the separation space communicate with each other. The cooling unit is configured to cool the separation space. The cooling unit is capable of cooling the separation space to 400° C. or lower. The supply pipe includes a dopant gas supply pipe through which an ammonia-based gas included in the reactant gas is to be supplied, a growth gas supply pipe through which a growth gas containing a silane-based gas and a chlorine-based gas and included in the reactant gas is to be supplied, and an inert gas supply pipe through which an inert gas included in the reactant gas is to be supplied between a portion of the separation space to which the ammonia-based gas is to be supplied and a portion of the separation space to which the chlorine-based gas is to be supplied.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
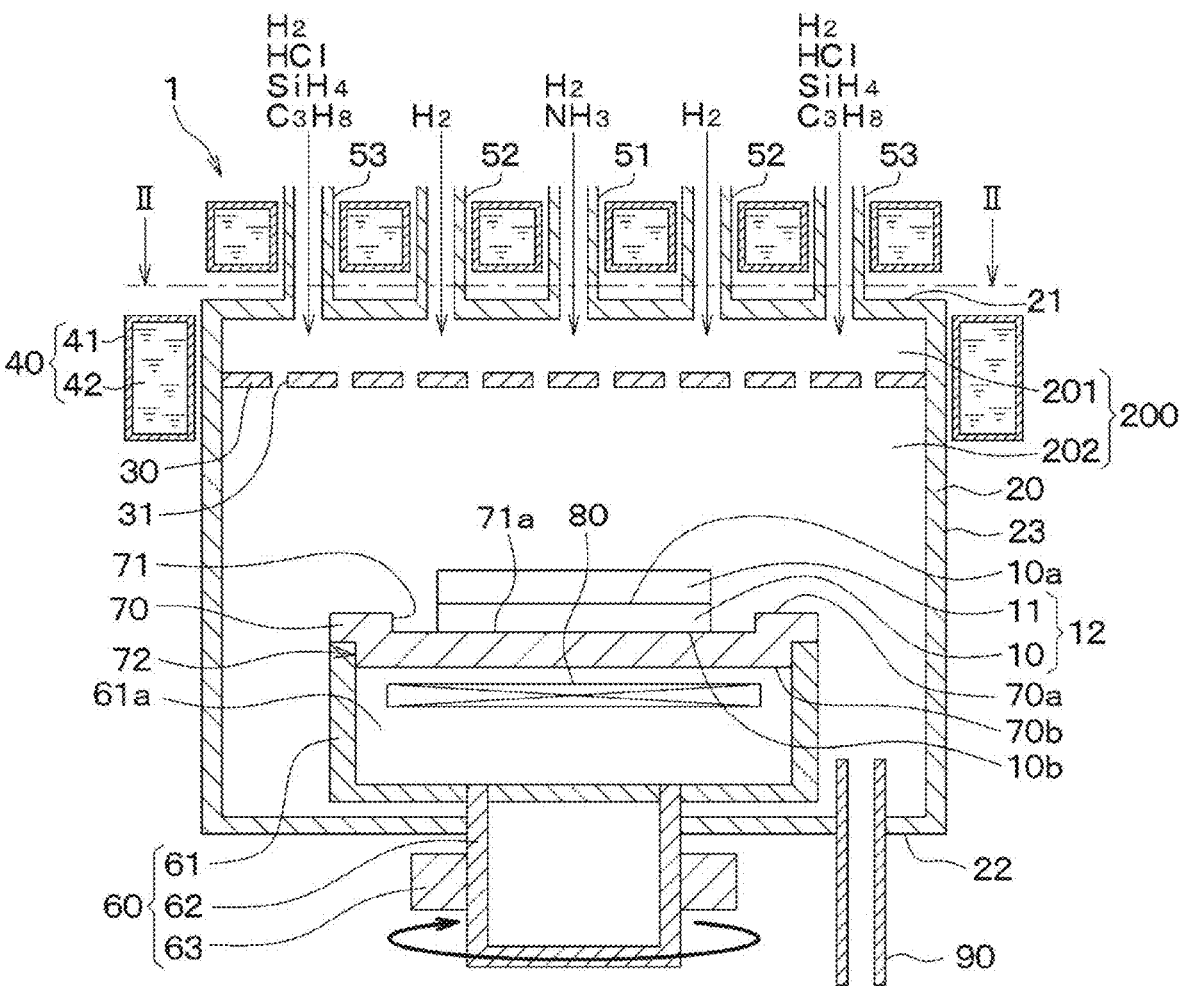
FIG. 1 is a schematic view illustrating a SiC wafer manufacturing apparatus according to a first embodiment.

Next, a relevant technology is described only for understanding the following embodiments. A SiC wafer manufacturing apparatus according to the relevant technology includes a shower head that substantially divides a reaction chamber into a separation space to which a reactant gas is first supplied and a growth space in which a seed substrate is disposed. The shower head has a plurality of through holes that allow the separation space and the growth space to communicate with each other. In the SiC wafer manufacturing apparatus, the reactant gas supplied to the separation space is supplied to the growth space through the plurality of through holes, so that the reactant gas is easily uniformly supplied onto the seed substrate.

The reactant gas includes a chlorine-based gas for growing an epitaxial layer, an ammonia-based gas as a dopant gas, and the like. Therefore, there is a possibility that the chlorine-based gas and the ammonia-based gas react with each other in the separation space to generate solid ammonium chloride, and the through holes of the shower head are clogged with the ammonium chloride.

The SiC wafer manufacturing apparatus may include a partition wall for dividing the separation space into a plurality of spaces. In such a configuration, solid ammonium chloride is less likely to be generated in the separation space when the chlorine-based gas and the ammonia-based gas are supplied to separate spaces.

However, in the above-described SiC wafer manufacturing apparatus, since the wall portion is provided, the configuration of the shower head is likely to be complicated.

A silicon carbide wafer manufacturing apparatus according to an aspect of the present disclosure includes a chamber, a susceptor, a supply pipe, a shower head, and a cooling unit. The chamber forms a reaction chamber to which a reactant gas is to be supplied for growing an epitaxial layer made of silicon carbide on a front surface of a seed substrate made of silicon carbide. The chamber has a cylindrical shape having an upper portion and a lower portion. The susceptor is disposed in the chamber at a position close to the lower portion, and the seed substrate is to be disposed on the susceptor. The supply pipe is connected to the upper portion of the chamber and is configured to supply the reactant gas to the reaction chamber. The shower head is disposed to partition the reaction chamber into a growth space close to the lower portion and a separation space close to the upper portion. The shower head has a plurality of through holes through which the growth space and the separation space communicate with each other. The cooling unit is configured to cool the separation space. The cooling unit is capable of cooling the separation space to 400° C. or lower. The supply pipe includes a dopant gas supply pipe through which an ammonia-based gas included in the reactant gas is to be supplied, a growth gas supply pipe through which a growth gas containing a silane-based gas and a chlorine-based gas and included in the reactant gas is to be supplied, and an inert gas supply pipe through which an inert gas included in the reactant gas is to be supplied between a portion of the separation space to which the ammonia-based gas is to be supplied and a portion of the separation space to which the chlorine-based gas is to be supplied.

In the above-described SiC wafer manufacturing apparatus, since the separation space is cooled to 400° C. or lower by the cooling unit, it is possible to restrict the silane-based gas from being decomposed in the separation space to generate solid silicon, and it is possible to restrict the through holes of the shower head from being clogged. The inert gas supply pipe is disposed to supply the inert gas between the portion of the separation space to which the ammonia-based gas is supplied and the portion of the separation space to which the chlorine-based gas is supplied. Therefore, in the separation space, it is possible to restrict the reaction between the ammonia-based gas and the chlorine-based gas without disposing a partition wall or the like in the separation space, and it is possible to restrict clogging of the through holes of the shower head. Therefore, in the SiC wafer manufacturing apparatus, it is possible to restrict the clogging of the through holes of the shower head without disposing a partition wall or the like that partitions the separation space into a plurality of spaces, and it is possible to simplify the configuration of the shower head.

Hereinafter, embodiments of the present disclosure will be described with reference to the drawings. In the following embodiments, the same or equivalent parts are denoted by the same reference numerals for description.

First Embodiment

Figure 2:
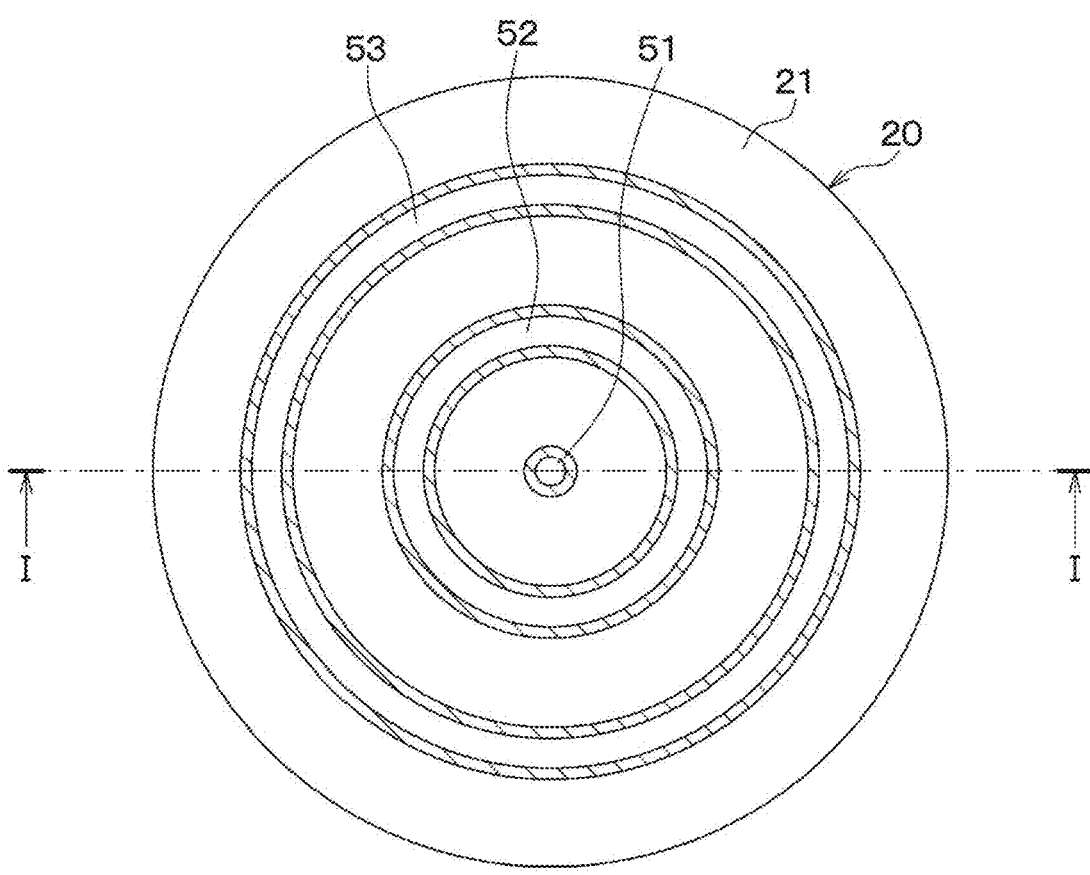
FIG. 2 is a cross-sectional view of the semiconductor device taken along a line II-II shown in FIG. 1.

A SiC wafer manufacturing apparatus (hereinafter, also simply referred to as a manufacturing apparatus) 1 of a first embodiment will be described with reference to FIG. 1 and FIG. 2. FIG. 1 is a cross-sectional view taken along a line I-I in FIG. 2.

As shown in FIG. 1, the manufacturing apparatus 1 includes a chamber 20 that forms a reaction chamber 200 for growing an epitaxial layer 11 as a semiconductor layer on a front surface 10a of a seed substrate 10 to manufacture a SiC wafer 12.

The chamber 20 has a substantially cylindrical shape having an upper portion 21, a lower portion 22, and a side portion 23 connecting the upper portion 21 and the lower portion 22. The chamber 20 has a shower head 30 that substantially partitions the reaction chamber 200 into a separation space 201 close to the upper portion 21 and a growth space 202 close to the lower portion 22. The shower head 30 is made of, for example, a metal such as stainless steel (SUS), and has a plurality of through holes 31 through which the separation space 201 and the growth space 202 communicate with each other.

As will be described later, the seed substrate 10 is disposed in the growth space 202. The shower head 30 is disposed above the seed substrate 10 and is formed so that the through holes 31 include a position facing the front surface 10a of the seed substrate 10. Therefore, the reactant gas supplied to the separation space 201 is supplied toward the front surface 10a of the seed substrate 10 from a direction intersecting the front surface 10a of the seed substrate 10 (that is, a direction substantially perpendicular to the front surface 10a) through the through holes 31. Therefore, it can be said that the manufacturing apparatus 1 of the present embodiment has a downflow-type gas supply structure in which the reactant gas is blown down toward the front surface 10a of the seed substrate 10.

A cooling unit 40 for cooling the separation space 201 is disposed around the separation space 201 in the chamber 20. The cooling unit 40 is configured such that, for example, cooling water 42 circulates through a cooling passage 41. Actually, the cooling unit 40 has a flowing water inlet and a flowing water outlet, which are not shown, and is configured to cool the separation space 201 by introducing the cooling water 42 from the flowing water inlet and discharging the cooling water 42 from the flowing water outlet. In the present embodiment, as will be described later, silane gas as a part of the reactant gas is supplied to the separation space 201. The cooling unit 40 is controlled so that a temperature of the separation space 201 is 400° C. or lower so that the silane gas is not decomposed in the separation space 201. Although the configuration in which the cooling unit 40 is disposed around the separation space 201 has been described here, the cooling unit 40 may be configured such that, for example, a predetermined space is formed in the side portion 23 of the chamber 20, and the cooling water 42 circulates through the space as the cooling passage 41.

The chamber 20 has first to third supply pipes 51 to 53 for supplying the reactant gas for growing the epitaxial layer 11 into the separation space 201. In the present embodiment, the chamber 20 has a cylindrical shape, and the upper portion 21 has a disc shape. The first supply pipe 51 has a cylindrical shape and is disposed at a substantially central portion of the upper portion 21. The second supply pipe 52 has an annular cylindrical shape (that is, frame cylindrical shape) and is disposed so as to surround the first supply pipe 51. The third supply pipe 53 has an annular cylindrical shape (that is, frame cylindrical shape) and is disposed so as to surround the second supply pipe 52. In the present embodiment, an example in which each of the second supply pipe 52 and the third supply pipe 53 is formed in the annular cylindrical shape will be described, but each of the second supply pipe 52 and the third supply pipe 53 may be formed in a polygonal frame shape.

The reactant gas includes, for example, a source gas as a growth gas including silane (SiH$_4$) gas and propane (C$_3$H$_8$) gas, and an etching gas as a growth gas including hydrogen chloride (HCl) gas. The reactant gas further includes a dopant gas containing ammonia (NH$_3$) gas and a carrier gas containing hydrogen gas.

The carrier gas is a gas that is difficult to react with silane gas or ammonia gas, and can also be said to be an inert gas. In other words, the inert gas is a gas that is less likely to react with the silane gas than the ammonia gas, and is also a gas that is less likely to react with the ammonia gas than the silane gas. In addition, in the present embodiment, hydrogen gas is described as an example of the carrier gas, but the carrier gas may be argon (Ar) gas or helium (He) gas. In the present embodiment, the ammonia gas corresponds to ammonia-base gas, the hydrogen chloride gas corresponds to chlorine-base gas, and the silane gas corresponds to silane-based gas.

In the present embodiment, the dopant gas (that is, the ammonia gas) is supplied from the first supply pipe 51. The source gas (that is, the silane gas and the propane gas) and the etching gas (that is, the hydrogen chloride gas) are supplied from the third supply pipe 53. The carrier gas (that is, the hydrogen gas) is supplied from the first to third supply pipes 51 to 53. That is, in the present embodiment, the second supply pipe 52 through which the hydrogen gas that is difficult to react with the ammonia gas and the hydrogen chloride gas is supplied is disposed between the first supply pipe 51 through which the ammonia gas is supplied and the third supply pipe 53 through which the hydrogen chloride gas is supplied when viewed in an axial direction of the chamber 20 (hereinafter, also simply referred to as an axial direction). In other words, "when viewed in the axial direction of the chamber 20" can also be referred to as "in the normal direction to a plane direction of the upper portion 21", and can also be referred to as "when viewed in the normal direction to the plane direction of the upper portion 21". In the present embodiment, the first supply pipe 51 corresponds to a dopant gas supply pipe, the second supply pipe 52 corresponds to an inert gas supply pipe, and the third supply pipe 53 corresponds to a growth gas supply pipe.

The reactant gas is supplied from the first to third supply pipes 51 to 53 to the separation space 201, and then supplied to the growth space 202 through the through holes 31. At this time, the second supply pipe 52 is disposed between the first supply pipe 51 and the third supply pipe 53 when viewed in the axial direction. Therefore, in the separation space 201, the hydrogen gas supplied from the second supply pipe 52 is present between the ammonia gas supplied from the first supply pipe 51 and the hydrogen chloride gas supplied from the third supply pipe 53. Therefore, it can also be said that the second supply pipe 52 is disposed to supply the inert gas between a portion of the separation space 201 to which the ammonia gas is supplied and a portion of the separation space 201 to which the hydrogen chloride gas is supplied. In the separation space 201, since the hydrogen gas is present between the ammonia gas and the hydrogen chloride gas, it is possible to restrict the reaction between the ammonia gas and the hydrogen chloride gas without disposing a partition wall or the like in the separation space 201. In addition, since the carrier gas is also supplied from the second supply pipe 52, for each gas supplied from the separation space 201 to the growth space 202 through the through holes 31, and a difference in flow rate in the radial direction with respect to the axial direction of the chamber 20 is reduced as compared with a case where the second supply pipe 52 is not disposed. Therefore, it is possible to restrict the occurrence of convection in the gases supplied from the through holes 31.

A rotating device 60 to which the seed substrate 10 is to be disposed is disposed on a lower side of the chamber 20. In the present embodiment, the seed substrate 10 is disposed on a susceptor 70 disposed on the rotating device 60.

The rotating device 60 includes a cylindrical member 61, a rotating shaft 62, a driving unit 63, and the like. The cylindrical member 61 is a member having a bottomed cylindrical shape and forms a hollow chamber 61a, and the susceptor 70 is disposed at an opening end portion. The cylindrical member 61 is disposed such that the opening end portion faces toward the upper side (that is, the upper portion 21) of the chamber 20.

The rotating shaft 62 is a shaft that is rotated by an output of the driving unit 63, and is connected to the cylindrical member 61 so as to be rotatable integrally with the cylindrical member 61. The driving unit 63 includes a motor or the like that outputs a rotational force, and rotates the rotating shaft 62. In the rotating device 60 configured as described above, the rotating shaft 62 is rotated by the output of the driving unit 63, and the cylindrical member 61 and the susceptor 70 are integrally rotated.

The susceptor 70 has an outer shape corresponding to the opening end portion of the cylindrical member 61, and substantially closes the cylindrical member 61 by being disposed at the opening end portion of the cylindrical member 61. Accordingly, the hollow chamber 61a of the cylindrical member 61 is substantially closed.

Specifically, the susceptor 70 has a plate shape having a first surface 70a and a second surface 70b, and has a recessed portion 71 for accommodating the seed substrate 10 in a central portion close to the first surface 70a. The susceptor 70 further has a step portion 72 for fitting with the opening end portion of the cylindrical member 61 at an outer edge portion close to the second surface 70b. The susceptor 70 is disposed on the cylindrical member 61 by fitting the step portion 72 into the opening end portion of the cylindrical member 61.

The seed substrate 10 is mounted on the susceptor 70 such that a bottom surface 71a of the recessed portion 71 of the susceptor 70 serves as a mounting surface and a rear surface 10b of the seed substrate 10 faces the bottom surface 71a.

In the hollow chamber 61a, a heater 80 serving as a heating device for heating the seed substrate 10 (that is, the reaction chamber 200) is disposed. As the heater 80, for example, a resistance heating heater composed of carbon is used. Although not illustrated, the heater 80 is connected to a controller or the like and is heated to a predetermined temperature.

On the lower side of the chamber 20, a discharge pipe 90 for discharging a gas after reaction or an unreacted gas is provided. A portion of the discharge pipe 90 on a side opposite to the chamber 20 is connected to a vacuum pump (not shown). Accordingly, the reaction chamber 200 is maintained at a predetermined pressure.

Note that, although not particularly illustrated, a lifting device is disposed in the hollow chamber 61a. The lifting device assists, for example, loading of the susceptor 70 mounted with the seed substrate 10 into the reaction chamber 200 and unloading of the susceptor 70 from the reaction chamber 200 by a transfer robot. The lifting device may have a function of transferring the susceptor 70 to the transfer robot by raising the susceptor 70 and separating the susceptor 70 from the cylindrical member 61 when the susceptor 70 is transferred. However, the manufacturing apparatus 1 may also be configured not to perform loading and unloading of the susceptor 70 mounted with the seed substrate 10, but to perform loading and unloading of only the seed substrate 10 without moving the susceptor 70.

The above is the configuration of the manufacturing apparatus 1 according to the present embodiment. Next, a method of growing the epitaxial layer 11 on the front surface 10a of the seed substrate 10 using the above-described manufacturing apparatus 1 will be described.

First, in the manufacturing apparatus 1 as described above, while the susceptor 70 mounted with the seed substrate 10 is rotated at, for example, 200 rpm by the rotating device 60, the heater 80 is driven so that the temperature of the growth space 202 becomes about 1600 to 1750° C. In addition, the cooling unit 40 is driven so that the temperature of the separation space 201 becomes 400° C. or lower.

Then, by supplying the reactant gas from the first to third supply pipes 51 to 53 to the separation space 201, each gas is supplied from the through holes 31 of the shower head 30 to the growth space 202. For example, the flow rate of the ammonia gas supplied from the first supply pipe 51 is set to 30 sccm. The flow rate of the silane gas supplied from the third supply pipe 53 is set to 500 sccm, the flow rate of the propane gas is set to 150 sccm, and the flow rate of the hydrogen chloride gas is set to 5000 sccm. The flow rate of the hydrogen gas supplied from the first to third supply pipes 51 to 53 is 100 slm in total.

Then, in the growth space 202, the ammonia gas is taken in while the silane gas and the propane gas react with each other, and the epitaxial layer 11 formed of n-type SiC is grown on the seed substrate 10 to manufacture the SiC wafer 12.

At this time, since the separation space 201 is cooled to 400° C. or lower by the cooling unit 40, it is possible to restrict the silane gas from being decomposed in the separation space 201 to generate solid silicon. Therefore, clogging of the through holes 31 of the shower head 30 can be restricted.

Since the separation space 201 is cooled to 400° C. or lower by the cooling unit 40, there is a possibility that the ammonia gas and the silane gas react with each other to generate solid ammonium chloride in the separation space 201. However, in the present embodiment, as described above, since the second supply pipe 52 is disposed between the first supply pipe 51 and the third supply pipe 53 when viewed in the axial direction, hydrogen gas is present between the ammonia gas and the hydrogen chloride gas in the separation space 201. Therefore, in the separation space 201, it is possible to restrict the reaction between the ammonia gas and the hydrogen chloride gas without disposing a partition wall or the like in the separation space 201, and it is possible to restrict clogging of the through holes 31 of the shower head 30. Therefore, in the present embodiment, clogging of the through holes 31 can be restricted without disposing a partition wall or the like that partitions the separation space 201 into a plurality of spaces, and the configuration of the shower head 30 can be simplified.

Furthermore, since the carrier gas is also supplied from the second supply pipe 52, for each gas supplied from the separation space 201 to the growth space 202 through the through holes 31, and a difference in flow rate in the radial direction with respect to the axial direction of the chamber 20 is reduced as compared with the case where the second supply pipe 52 is not disposed. Therefore, it is possible to restrict the occurrence of convection in the gases supplied from the through holes 31.

As described above, in the present embodiment, since the separation space 201 is cooled to 400° C. or lower by the cooling unit 40, it is possible to restrict the silane gas from being decomposed in the separation space 201 to generate solid silicon, and it is possible to restrict the through holes 31 of the shower head 30 from being clogged.

The second supply pipe 52 is disposed to supply the inert gas between the portion to which the ammonia gas is supplied and the portion to which the hydrogen chloride gas is supplied in the separation space 201. Therefore, in the separation space 201, it is possible to restrict the reaction between the ammonia gas and the hydrogen chloride gas without disposing a partition wall or the like in the separation space 201, and it is possible to restrict clogging of the through holes 31 of the shower head 30.

Furthermore, since the carrier gas is also supplied from the second supply pipe 52, for each gas supplied from the separation space 201 to the growth space 202 through the through holes 31, and a difference in flow rate in the radial direction with respect to the axial direction of the chamber 20 is reduced as compared with the case where the second supply pipe 52 is not disposed. Therefore, it is possible to restrict the occurrence of convection in the gases supplied from the through holes 31.

In the present embodiment, the second supply pipe 52 is disposed between the first supply pipe 51 and the third supply pipe 53 when viewed in the axial direction. Therefore, the inert gas can be easily supplied between the portion to which the ammonia gas is supplied and the portion to which the hydrogen chloride gas is supplied in the separation space 201, and the reaction between the ammonia gas and the hydrogen chloride gas can be further restricted.

Second Embodiment

The following describes a second embodiment. The present embodiment is different from the first embodiment in that a protruding portion is formed on the shower head 30. The other configurations of the present embodiment are similar to those of the first embodiment, and therefore a description of the similar configurations will not be repeated.

Figure 3:
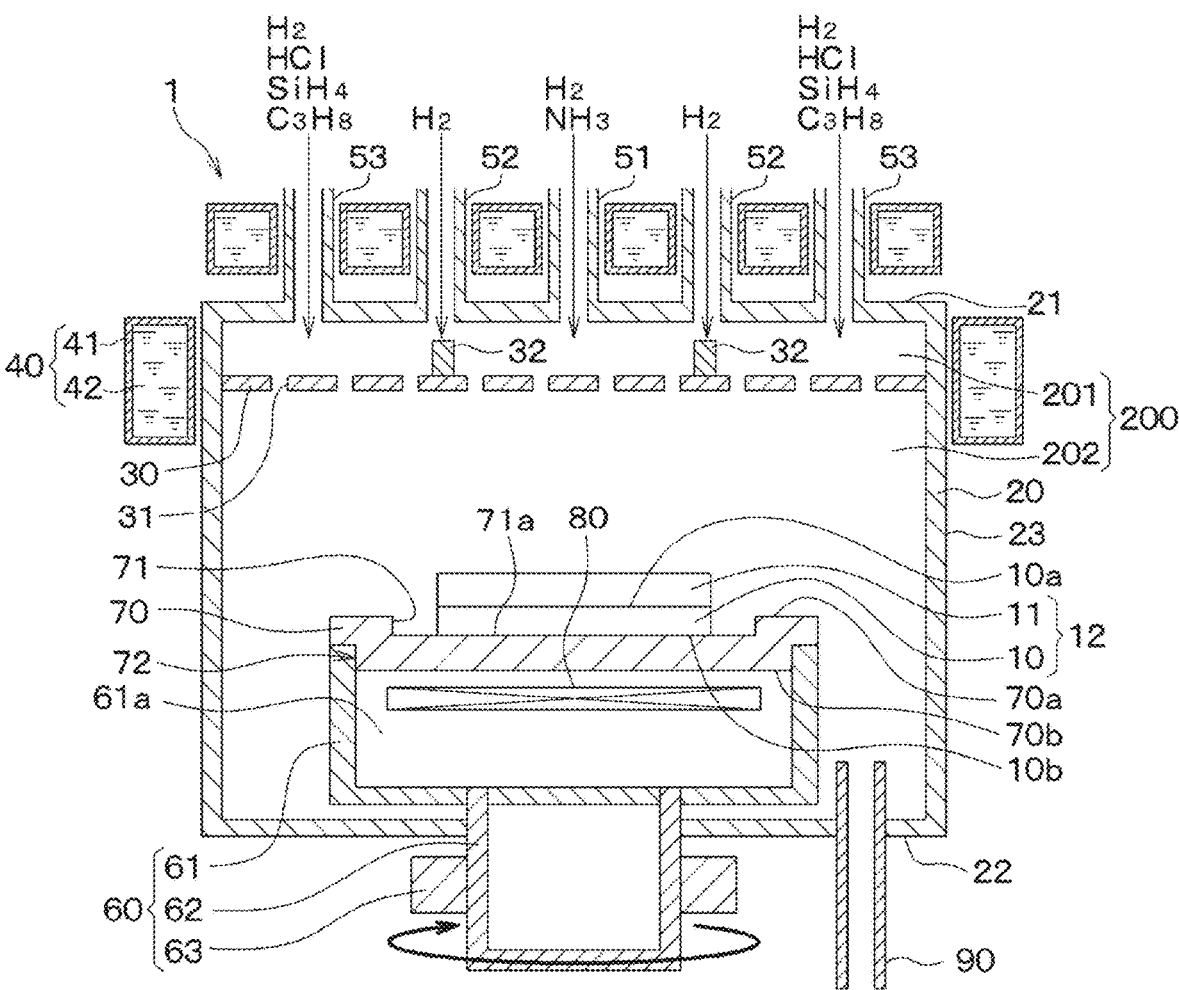
FIG. 3 is a schematic view illustrating a SiC wafer manufacturing apparatus according to a second embodiment.

As shown in FIG. 3, the shower head 30 of the present embodiment has a protruding portions 32 that protrudes toward the separation space 201 at a position facing the second supply pipe 52. In other words, the shower head 30 has the protruding portion 32 that narrows a flow path of the carrier gas supplied from the second supply pipe 52 to the separation space 201.

According to the present embodiment described above, the second supply pipe 52 for supplying the inert gas is disposed between the portion of the separation space 201 to which the ammonia gas is supplied and the portion of the separation space 201 to which the hydrogen chloride gas is supplied. Therefore, effects similar to those of the first embodiment can be obtained.

In the present embodiment, the shower head 30 has the protruding portion 32 that protrudes toward the separation space 201 at the position facing the second supply pipe 52. Therefore, a flow velocity of the hydrogen gas (that is, the carrier gas) supplied from the second supply pipe 52 increases when the hydrogen gas flows out from a portion of the separation space 201 located above the protruding portion 32 toward a connection portion with the first supply pipe 51 and a connection portion with the third supply pipe 53. Therefore, it is possible to restrict the ammonia gas supplied from the first supply pipe 51 from flowing toward the third supply pipe 53 through the portion located above the protruding portion 32, and it is possible to restrict the hydrogen chloride gas supplied from the third supply pipe 53 from flowing toward the first supply pipe 51 through the portion located above the protruding portion 32. Accordingly, it is possible to further restrict the reaction between the ammonia gas and the silane gas in the separation space 201.

Third Embodiment

The following describes a third embodiment. The present embodiment is different from the first embodiment in the configurations of the second supply pile 52 and the third supply pipe 53. The other configurations of the present embodiment are similar to those of the first embodiment, and therefore a description of the similar configurations will not be repeated.

Figure 4:
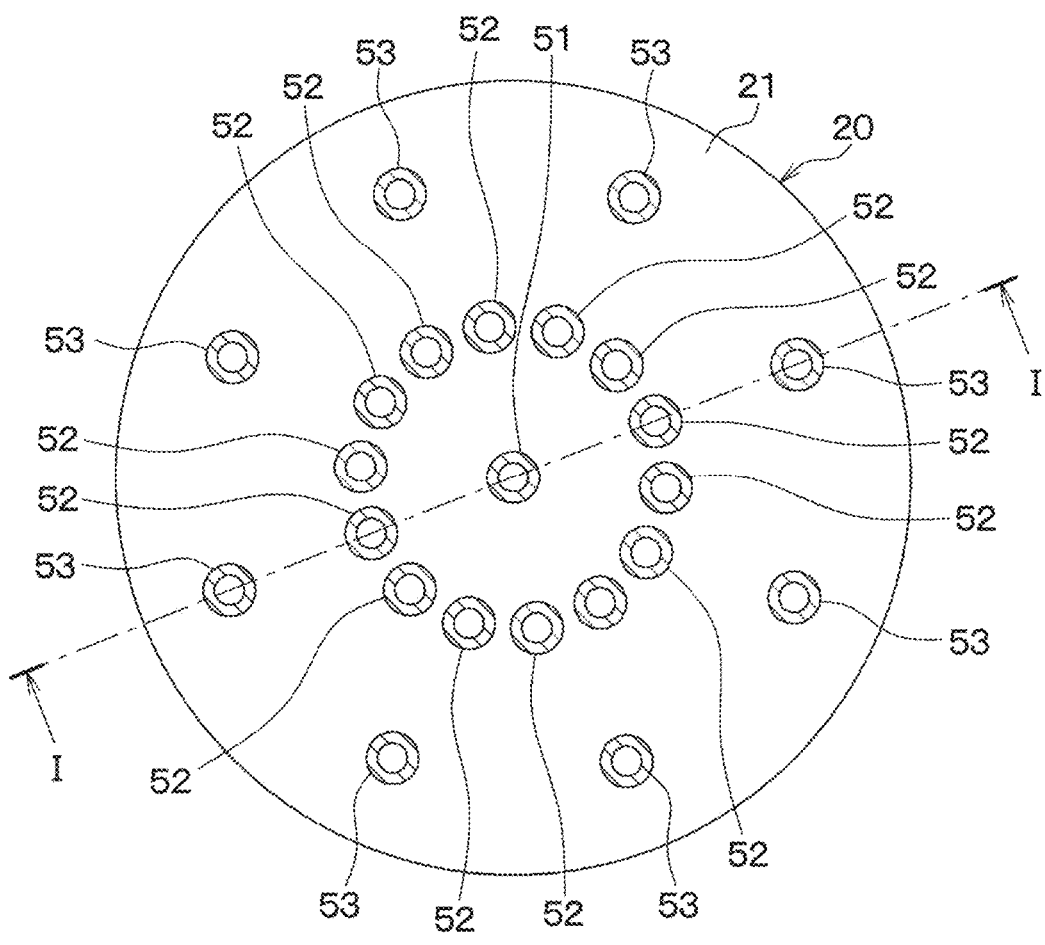
FIG. 4 is a top view of a chamber according to a third embodiment.

As shown in FIG. 4, the second supply pipe 52 and the third supply pipe 53 of the present embodiment are divided in a circumferential direction with respect to the axial direction as compared with the first embodiment. In other words, a plurality of second supply pipes 52 and a plurality of third supply pipes 53 are provided concentrically. In the present embodiment, each of the second supply pipe 52 and the third supply pipe 53 has a cylindrical shape, but may have a hollow polygonal columnar shape, or may have a mixture of a cylindrical shape and a hollow polygonal columnar shape.

According to the present embodiment described above, the second supply pipes 52 for supplying the inert gas are disposed between the portion of the separation space 201 to which the ammonia gas is supplied and the portions of the separation space 201 to which the hydrogen chloride gas is supplied. Therefore, effects similar to those of the first embodiment can be obtained.

In the present embodiment, the second supply pipes 52 and the third supply pipes 53 are disposed concentrically. Therefore, as compared with a case where each of the second supply pipe 52 and the third supply pipe 53 has the annular cylindrical shape, each of the supply pipes 51 to 53 can be easily formed.

Fourth Embodiment

The following describes a fourth embodiment. The present embodiment is different from the third embodiment in the arrangement positions of the first to third supply pipes 51 to 53. The other configurations of the present embodiment are similar to those of the third embodiment, and therefore a description of the similar configurations will not be repeated.

Figure 5:
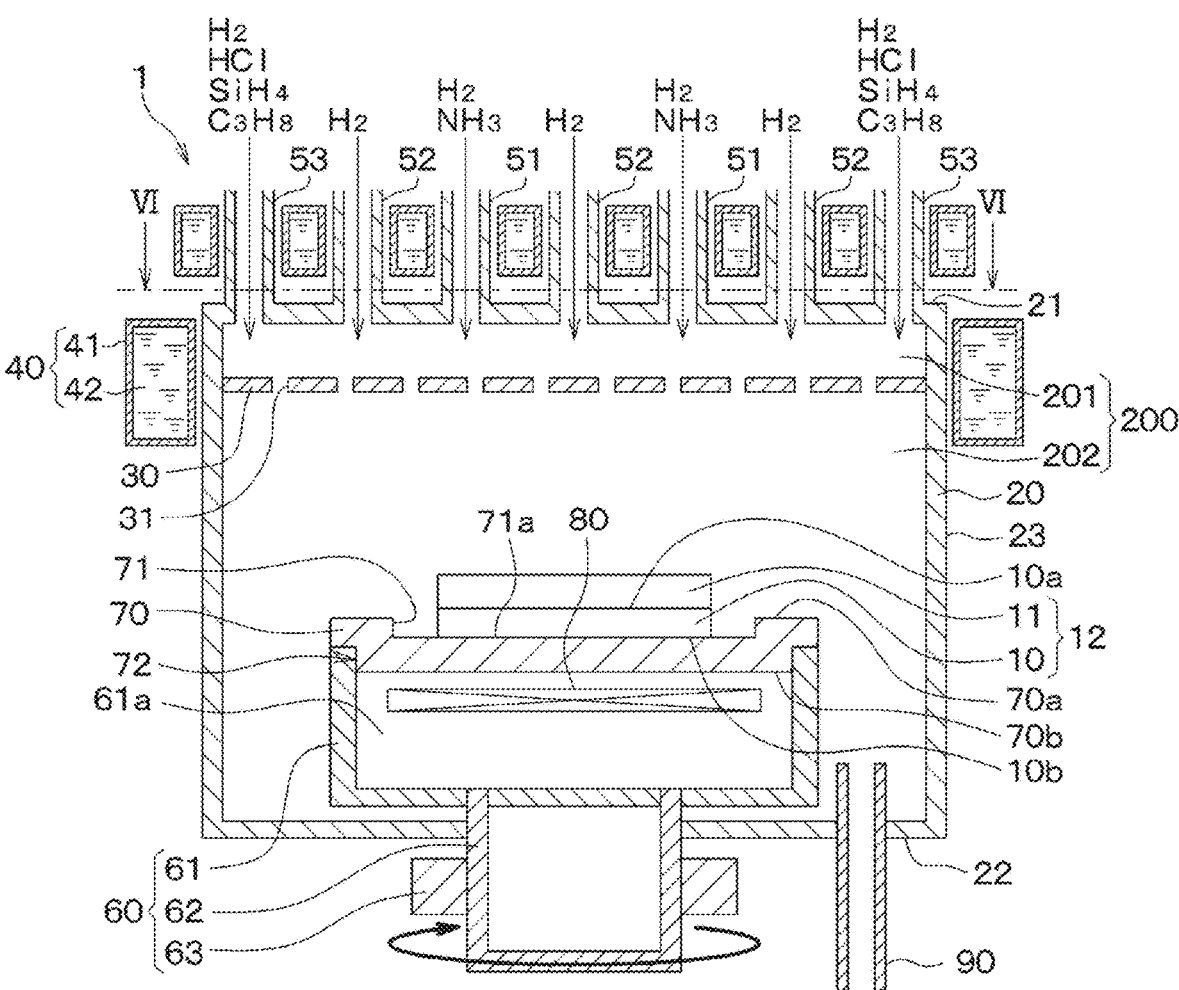
FIG. 5 is a schematic view illustrating a SiC wafer manufacturing apparatus according to a fourth embodiment.
Figure 6:
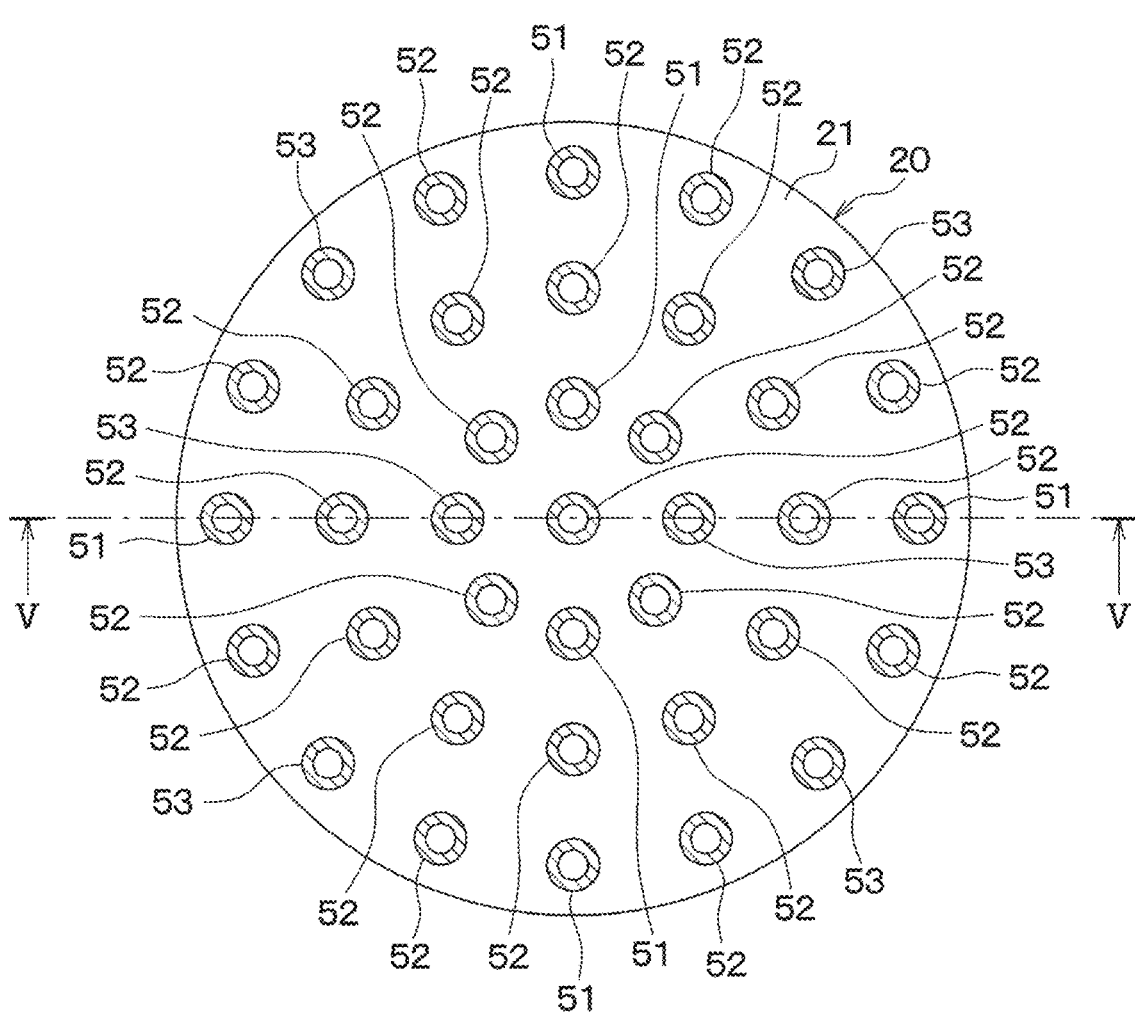
FIG. 6 is a cross-sectional view taken along a line VI-VI shown in FIG. 5.

As shown in FIG. 5 and FIG. 6, the first to third supply pipes 51 to 53 of the present embodiment are disposed in a scattered manner when viewed in the axial direction. However, the first to third supply pipes 51 to 53 are disposed concentrically when viewed in the axial direction, and each of the second supply pipes 52 is disposed between one of the first supply pipes 51 and one of the third supply pipes 53. In the present embodiment, one of the second supply pipes 52 is disposed at a substantially central portion of the upper portion 21, and the first to third supply pipes 51 to 53 are concentrically disposed so as to surround the one of the second supply pipes 52. FIG. 5 is a cross-sectional view taken along a line V-V in FIG. 6.

According to the present embodiment described above, the second supply pipes 52 for supplying the inert gas are respectively disposed between the portions of the separation space 201 to which the ammonia gas is supplied and the portions of the separation space 201 to which the hydrogen chloride gas is supplied. Therefore, effects similar to those of the first embodiment can be obtained.

In the present embodiment, the first to third supply pipes 51 to 53 are arranged in the scattered manner. Therefore, the growth gas and the dopant gas can be more uniformly supplied onto the seed substrate 10, and the quality of the epitaxial layer 11 can be improved.

Fifth Embodiment

The following describes a fifth embodiment. The present embodiment is different from the fourth embodiment in the arrangement positions of the first to third supply pipes 51 to 53. The other configurations of the present embodiment are similar to those of the fourth embodiment, and therefore a description of the similar configurations will not be repeated.

Figure 7:
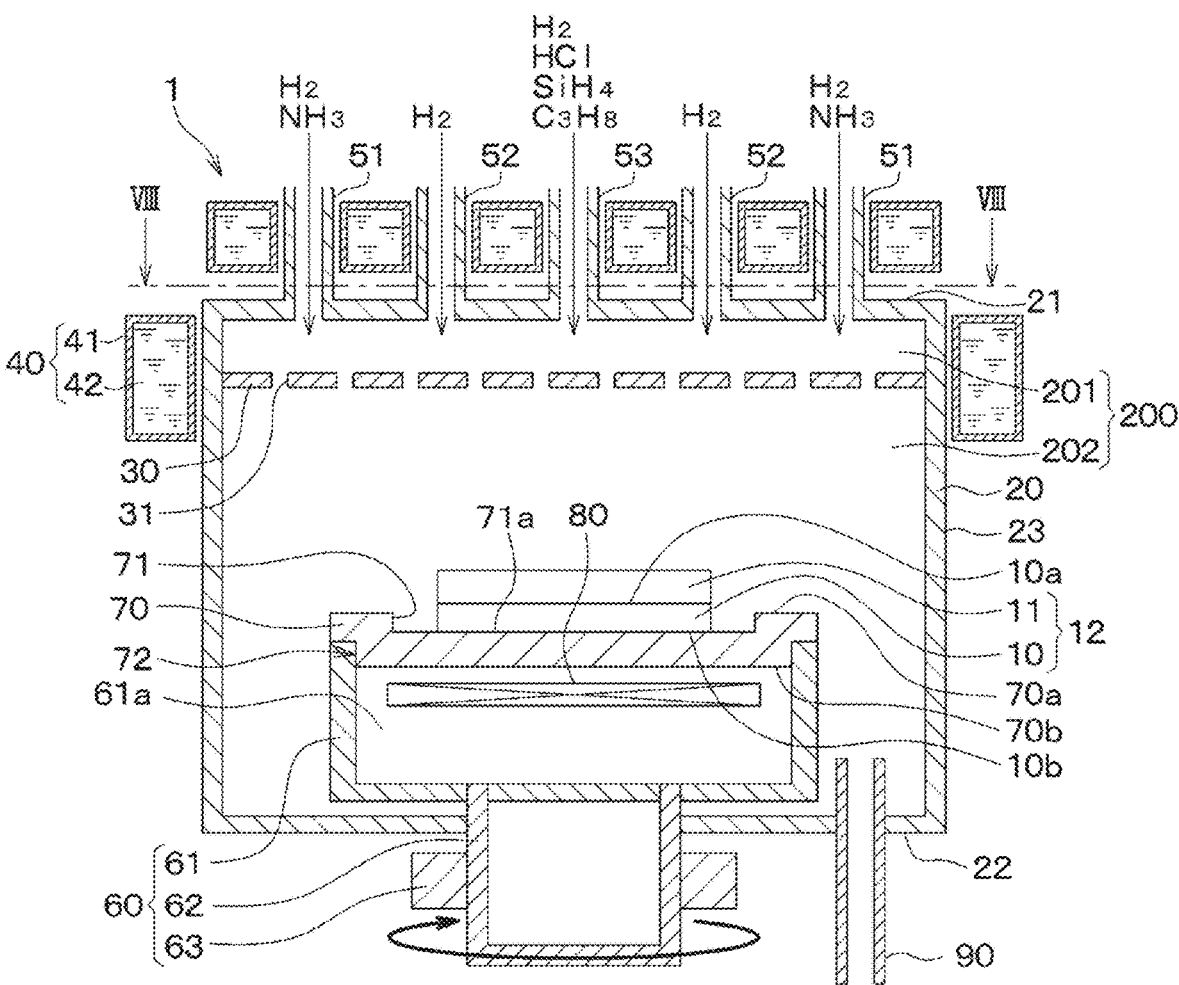
FIG. 7 is a schematic view illustrating a SiC wafer manufacturing apparatus according to a fifth embodiment.
Figure 8:
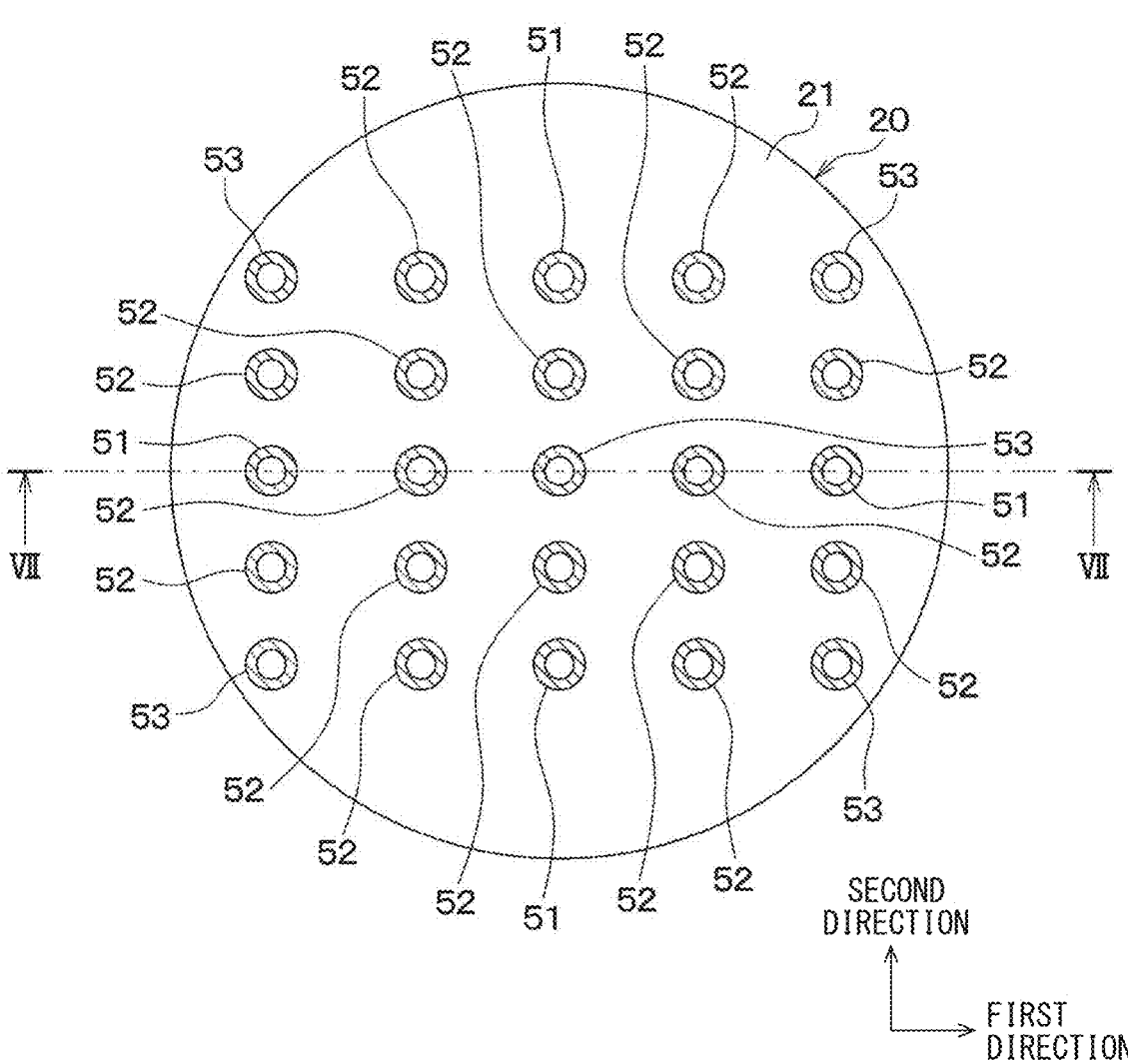
FIG. 8 is a cross-sectional view taken along a line VIII-VIII in FIG. 7.

As shown in FIG. 7 and FIG. 8, the first to third supply pipes 51 to 53 of the present embodiment are scattered along a first direction and a second direction in the plane direction of the upper portion 21 and the second direction intersects the first direction. The first to third supply pipes 51 to 53 are disposed such that each of the second supply pipes 52 is located between one of the first supply pipe 51 and one of the third supply pipes 53 when viewed in the axial direction. In the present embodiment, one of the third supply pipes 53 is disposed at a substantially central portion of the upper portion 21. FIG. 7 is a cross-sectional view taken along a line VII-VII in FIG. 8.

According to the present embodiment described above, the second supply pipes 52 for supplying the inert gas are respectively disposed between the portions of the separation space 201 to which the ammonia gas is supplied and the portions of the separation space 201 to which the hydrogen chloride gas is supplied. Therefore, effects similar to those of the first embodiment can be obtained.

Even when the first to third supply pipes 51 to 53 are scattered along the first direction and the second direction as in the present embodiment, as long as each of the second supply pipes 52 is disposed between one of the first supply pipes 51 and one of the third supply pipes 53 when viewed in the axial direction, it is possible to obtain effects similar to those in the fourth embodiment.

Sixth Embodiment

The following describes a sixth embodiment. The present embodiment is a combination of the second embodiment and the fourth embodiment. The other configurations of the present embodiment are similar to those of the second embodiment and the fourth embodiment, and therefore a description of the similar configurations will not be repeated.

Figure 9:
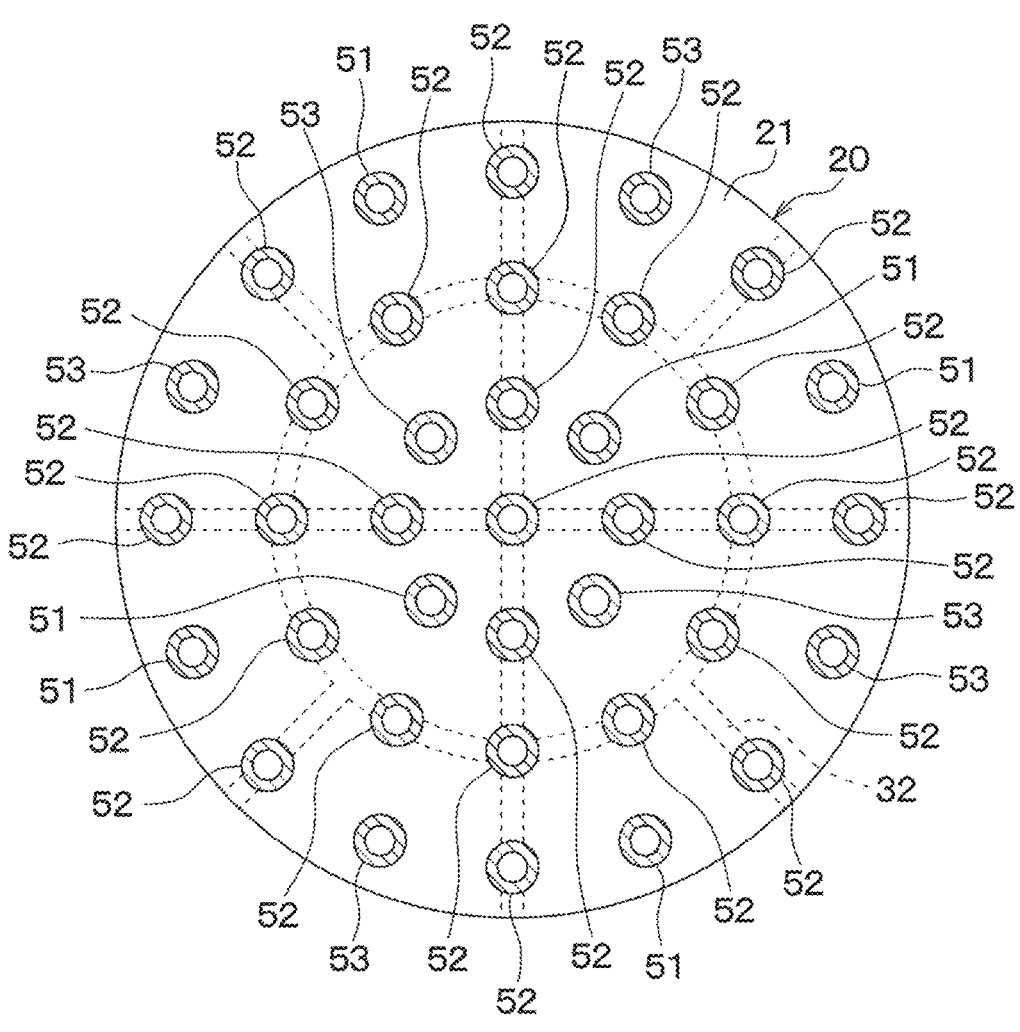
FIG. 9 is a top view of a chamber according to a sixth embodiment.

In the present embodiment, as shown in FIG. 9, the shower head 30 has a protruding portion 32 at a portion facing the second supply pipes 52. The first to third supply pipes 51 to 53 are disposed in a scattered manner. However, as compared with the second embodiment, the arrangement positions are appropriately changed so that the protruding portion 32 is easily provided. The first to third supply pipes 51 to 53 are disposed such that each of the second supply pipes 52 is positioned between one of the first supply pipes 51 and one of the third supply pipes 53 when viewed in the axial direction.

According to the present embodiment described above, the second supply pipes 52 for supplying the inert gas are respectively disposed between the portions of the separation space 201 to which the ammonia gas is supplied and the portions of the separation space 201 to which the hydrogen chloride gas is supplied. Therefore, effects similar to those of the second embodiment and the fourth embodiment can be obtained.

Other Embodiments

Although the present disclosure has been described in accordance with the embodiments, it is understood that the present disclosure is not limited to such embodiments or structures. The present disclosure encompasses various modifications and variations within the scope of equivalents. Furthermore, various combination and configuration, and other combination and configuration including one, more than one or less than one element may be made in the present disclosure.

For example, in each of the above-described embodiments, the growth gas may be a gas including trichlorosilane gas. In this case, hydrogen chloride gas may not be included. In such a configuration, the trichlorosilane gas corresponds to the silane-based gas and the chlorine-based gas.

Furthermore, in each of the above-described embodiments, a plurality of third supply pipes 53 may be provided, and the silane gas and the hydrogen chloride gas may be supplied from separate supply pipes. In this case, for example, in the third embodiment and the like, the silane gas may be supplied from a part of the plurality of third supply pipes 53 and the hydrogen chloride gas may be supplied from the remaining part of the plurality of third supply pipes 53.

In each of the above-described embodiments, the hydrogen gas (that is, the inert gas) may be supplied from at least the second supply pipe 52.

Furthermore, in the third to sixth embodiments, the arrangement positions of the first to third supply pipes 51 to 53 can be appropriately changed.

The above-described embodiments can also be combined with each other. For example, the shower head 30 may have the protruding portion 32 by combining the second embodiment with the third embodiment or the fifth embodiment.

What is claimed is:

1. A silicon carbide wafer manufacturing apparatus comprising:

a chamber forming a reaction chamber to which a reactant gas is to be supplied for growing an epitaxial layer made of silicon carbide on a front surface of a seed substrate made of silicon carbide, the chamber having a cylindrical shape having an upper portion and a lower portion;

a susceptor disposed in the chamber and on which the seed substrate is to be disposed;

a supply pipe connected to the upper portion of the chamber and configured to supply the reactant gas to the reaction chamber;

a shower head disposed to partition the reaction chamber into a growth space and a separation space, the shower head having a plurality of through holes through which the growth space and the separation space communicate with each other; and a cooling unit configured to cool the separation space, wherein the growth space is a space in the reaction chamber between the shower head and the lower portion of the chamber, the separation space is a space in the reaction chamber between the shower head and the upper portion of the chamber, the susceptor is disposed in the growth space, the cooling unit is capable of cooling the separation space to 400° C. or lower, the supply pipe includes a dopant gas supply pipe through which an ammonia-based gas included in the reactant gas is to be supplied, a growth gas supply pipe through which a growth gas containing a silane-based gas and a chlorine-based gas and included in the reactant gas is to be supplied, and an inert gas supply pipe through which an inert gas included in the reactant gas is to be supplied between a portion of the separation space to which the ammonia-based gas is to be supplied and a portion of the separation space to which the chlorine-based gas is to be supplied, the dopant gas supply pipe is configured to supply the ammonia-based gas to the separation space, the growth gas supply pipe is configured to supply the growth gas to the separation space, and the inert gas supply pipe is configured to supply the inert gas to the separation space.

2. The silicon carbide wafer manufacturing apparatus according to claim 1, wherein the inert gas supply pipe is disposed between the dopant gas supply pipe and the growth gas supply pipe when viewed in an axial direction of the chamber.

3. The silicon carbide wafer manufacturing apparatus according to claim 1, wherein the shower head has a protruding portion that protrudes toward the separation space at a position facing the inert gas supply pipe.

4. The silicon carbide wafer manufacturing apparatus according to claim 3, wherein the protruding portion is configured to narrow a flow path of the inert gas supplied from the inert gas supply pipe.

5. The silicon carbide wafer manufacturing apparatus according to claim 1, wherein the dopant gas supply pipe has a cylindrical shape, the inert gas supply pipe has a frame cylindrical shape surrounding the dopant gas supply pipe, and the growth gas supply pipe has a frame cylindrical shape surrounding the inert gas supply pipe.

6. The silicon carbide wafer manufacturing apparatus according to claim 1, wherein each of the dopant gas supply pipe, the growth gas supply pipe, and the inert gas supply pipe includes a plurality of pipes disposed in a scattered manner, and each of the plurality of pipes has a cylindrical shape.

7. The silicon carbide wafer manufacturing apparatus according to claim 6, wherein the plurality of pipes of the dopant gas supply pipe, the plurality of pipes of the growth gas supply pipe, and the plurality of pipes of the inert gas supply pipe are concentrically scattered.

8. The silicon carbide wafer manufacturing apparatus according to claim 6, wherein the plurality of pipes of the dopant gas supply pipe, the plurality of pipes of the growth gas supply pipe, and the plurality of pipes of the inert gas supply pipe are scattered along a first direction and a second direction in a plane direction of the upper portion, and the second direction intersects the first direction.

9. A silicon carbide wafer manufacturing apparatus comprising:

a chamber forming a reaction chamber to which a reactant gas is to be supplied for growing an epitaxial layer made of silicon carbide on a front surface of a seed substrate made of silicon carbide, the chamber having a cylindrical shape having an upper portion and a lower portion;

a susceptor disposed in the chamber and on which the seed substrate is to be disposed;

a supply pipe connected to the upper portion of the chamber and configured to supply the reactant gas to the reaction chamber;

a shower head disposed to partition the reaction chamber into a growth space and a separation space, the shower head having a plurality of through holes through which the growth space and the separation space communicate with each other; and a cooling unit configured to cool the separation space, wherein the growth space is a space in the reaction chamber between the shower head and the lower portion of the chamber, the separation space is a space in the reaction chamber between the shower head and the upper portion of the chamber, the susceptor is disposed in the growth space, the cooling unit is capable of cooling the separation space to 400° C. or lower, the supply pipe includes at least one dopant gas supply pipe through which an ammonia-based gas included in the reactant gas is to be supplied, at least one growth gas supply pipe through which a growth gas containing a silane-based gas and a chlorine-based gas and included in the reactant gas is to be supplied, and at least one inert gas supply pipe through which an inert gas included in the reactant gas is to be supplied, wherein an inert gas supply pipe of the at least one inert gas supply pipe is disposed between each portion of the separation space to which the ammonia-based gas is to be supplied and each portion of the separation space to which the chlorine-based gas is to be supplied.

10. The silicon carbide wafer manufacturing apparatus according to claim 9, wherein an inert gas supply pipe of the at least one inert gas supply pipe is disposed between each dopant gas supply pipe of the at least one dopant gas supply pipe and each growth gas supply pipe of the at least one growth gas supply pipe when viewed in an axial direction of the chamber.

11. The silicon carbide wafer manufacturing apparatus according to claim 9, wherein the shower head has a protruding portion that protrudes toward the separation space at a position facing the inert gas supply pipe of the at least one inert gas supply pipe.

12. The silicon carbide wafer manufacturing apparatus according to claim 11, wherein the protruding portion is configured to narrow a flow path of the inert gas supplied from the inert gas supply pipe of the at least one inert gas supply pipe.

13. The silicon carbide wafer manufacturing apparatus according to claim 9, wherein each dopant gas supply pipe of the at least one dopant gas supply pipe has a cylindrical shape, each inert gas supply pipe of the at least one inert gas supply pipe has a frame cylindrical shape surrounding a respective dopant gas supply pipe of the at least one dopant gas supply pipe, and each growth gas supply pipe of the at least one growth gas supply pipe has a frame cylindrical shape surrounding a respective inert gas supply pipe of the at least one inert gas supply pipe.

14. The silicon carbide wafer manufacturing apparatus according to claim 9, wherein each of the at least one dopant gas supply pipe, the at least one growth gas supply pipe, and the at least one inert gas supply pipe includes a plurality of pipes disposed in a scattered manner, and each of the plurality of pipes has a cylindrical shape.

15. The silicon carbide wafer manufacturing apparatus according to claim 14, wherein the plurality of pipes of the at least one dopant gas supply pipe, the plurality of pipes of the at least one growth gas supply pipe, and the plurality of pipes of the at least one inert gas supply pipe are concentrically scattered.

16. The silicon carbide wafer manufacturing apparatus according to claim 14, wherein the plurality of pipes of the at least one dopant gas supply pipe, the plurality of pipes of the at least one growth gas supply pipe, and the plurality of pipes of the at least one inert gas supply pipe are scattered along a first direction and a second direction in a plane direction of the upper portion, and the second direction intersects the first direction.

* * * * *